US010768221B2

(12) United States Patent
Laquai et al.

(10) Patent No.: US 10,768,221 B2
(45) Date of Patent: Sep. 8, 2020

(54) TEST EQUIPMENT, METHOD FOR OPERATING A TEST EQUIPMENT AND COMPUTER PROGRAM

(71) Applicant: Advantest Corporation, Tokyo (JP)

(72) Inventors: Bernd Laquai, Stuttgart (DE); Stefan Gross, Herrenberg (DE); Ingolf Martin, Balingen (DE); Alfred Rosenkränzer, Herrenberg (DE); Detlef Müller, Renningen (DE)

(73) Assignee: ADVANTEST CORPORATION, Tokyo (JP)

( * ) Notice: Subject to any disclaimer, the term of this patent is extended or adjusted under 35 U.S.C. 154(b) by 378 days.

(21) Appl. No.: 15/626,050

(22) Filed: Jun. 16, 2017

(65) Prior Publication Data
US 2017/0322252 A1 Nov. 9, 2017

Related U.S. Application Data

(63) Continuation of application No. PCT/EP2014/079267, filed on Dec. 23, 2014.

(51) Int. Cl.
*G01R 31/28* (2006.01)
*G01R 31/319* (2006.01)

(52) U.S. Cl.
CPC ..... *G01R 31/2834* (2013.01); *G01R 31/3191* (2013.01); *G01R 31/31908* (2013.01)

(58) Field of Classification Search
CPC ............ G01R 31/2834; G01R 31/3191; G01R 31/31908
See application file for complete search history.

(56) References Cited

U.S. PATENT DOCUMENTS 5,113,139 A 5/1992 Furukawa
6,140,822 A 10/2000 Williams
(Continued)

FOREIGN PATENT DOCUMENTS

EP 0626588 11/1994
EP 0984291 3/2000
(Continued)

OTHER PUBLICATIONS

Nieuwoudt, I et al., "Algorithms for a Shared Resource Scheduling Problem in Which Some Level of Conflict is Tolerable," Journal of Scheduling, Kluwer Academic Publishers, vol. 15, No. 6, Sep. 29, 2012, pp. 681-702.
(Continued)

*Primary Examiner* — Regis J Betsch

(57) ABSTRACT

A test equipment has a signal input/signal output and a use-site calibration unit for determining a user-site compensation function. The user-site compensation function has a compensation magnitude function and a compensation Hilbert phase function. The calibration unit has a level meter and a calculator. The level meter is configured to measure a magnitude characteristic of the electrical signal, the magnitude characteristic being the basis for the determination of the compensation Hilbert phase function. The calculator is configured to determine a Hilbert phase characteristic of the electrical signal based on a Hilbert transformation of a function dependent on the measured magnitude characteristic and to determine the compensation Hilbert phase function on the basis of the Hilbert phase characteristic.

21 Claims, 14 Drawing Sheets

(56) References Cited

U.S. PATENT DOCUMENTS

| | | |
|---|---|---|
| 6,327,545 B1 | 12/2001 | Browen et al. |
| 6,397,160 B1 | 5/2002 | Craig et al. |
| 6,795,496 B1 | 9/2004 | Soma et al. |
| 7,084,722 B2 | 8/2006 | Goyette |
| 7,171,002 B2 | 1/2007 | Coats et al. |
| 7,256,585 B1 | 8/2007 | Shoulders |
| 7,545,224 B2 | 6/2009 | Chow et al. |
| 2004/0004466 A1 | 1/2004 | Miyanaga et al. |
| 2005/0050546 A1 | 3/2005 | Remany et al. |
| 2005/0068068 A1 | 3/2005 | Hall |
| 2005/0104758 A1 | 5/2005 | Funyu et al. |
| 2005/0234662 A1 | 10/2005 | Niedzwiecki et al. |
| 2009/0092177 A1 | 4/2009 | Dvorak et al. |
| 2009/0129129 A1 | 5/2009 | Udagawa |
| 2009/0272634 A1 | 11/2009 | Ehlers et al. |
| 2010/0225301 A1 | 9/2010 | Nakayama et al. |
| 2010/0228515 A1 | 9/2010 | Srinivasan et al. |
| 2010/0309952 A1* | 12/2010 | Asami .............. G01R 23/20 375/132 |
| 2010/0312506 A1 | 12/2010 | Taylor |
| 2011/0163900 A1* | 7/2011 | Pagnanelli .......... H03M 3/468 341/143 |
| 2011/0227767 A1* | 9/2011 | O'Brien .............. G01D 5/24452 341/118 |
| 2012/0049655 A1 | 3/2012 | Leyendecker et al. |
| 2012/0221279 A1 | 8/2012 | Zhang |
| 2012/0269513 A1* | 10/2012 | Abe .................. H04B 10/532 398/65 |
| 2013/0006567 A1 | 1/2013 | Horn |
| 2013/0229068 A1 | 9/2013 | Sanders, III et al. |
| 2013/0234723 A1 | 9/2013 | Behrens et al. |

FOREIGN PATENT DOCUMENTS

| | | |
|---|---|---|
| EP | 1298778 | 4/2003 |
| JP | H11038087 | 2/1999 |
| JP | 2000009792 | 1/2000 |
| WO | 99/21025 | 4/1999 |
| WO | 2012/084028 | 6/2012 |
| WO | 2014/135194 | 9/2014 |

OTHER PUBLICATIONS

Liu, Lei, "Finite Automata for Evaluating Testbed Resource Contention," IEEE, Wireless Telecommunications Symposium WTS 2007, Piscataway, NJ, Apr. 26, 2007, pp. 1-6.

Quintanel , S., et al., "On-Wafer Multi-Port Circuits Characterization Technique with a Two-Port VNA," IEEE 81st ARFTG Microwave Measurement Conference, Seattle, WA, Jun. 7, 2013, pp. 1-4.

Lenk, F., et al., "A New Multiport Measurement-Method Using a Two-Port Network Analyzer," IEEE MTT-S International Microwave Symposium, Jun. 12-17, 2005, pp. 1663-1666.

Kam, D.G., et al., "Multiport Measurement Method Using a Two-Port Network Analyzer With Remaining Ports Unterminated," IEEE Microwave and Wireless Components Letters, vol. 17, No. 9, Sep. 2007, pp. 694-696.

Chen, C.-J., et al., "An Error Analysis of the Scattering Matrix Renormalization Transform," IEEE Transactions on Microwave Theory and Techniques, vol. 57, No. 4, Apr. 2009, pp. 863-868.

Rolfes, I., et al., "Multipart Method for the Measurement of the Scattering Parameters of N-Ports," IEEE Transactions on Microwave Theory and Techniques, vol. 53, No. 6, Jun. 2005, pp. 1990-1996.

Sismanoglou, P., et al., "Input Test Data Compression Based on the Reuse of Parts of Dictionary Entries: Static and Dynamic Approaches," IEEE Transactions on Computer-Aided Design of Integrated Circuits and Systems, vol. 32, No. 11, Nov. 2013, pp. 1762-1775.

White, H.E., "Printed English Compression by Dictionary Encoding," Proceedings of the IEEE, vol. 55, No. 3, Mar. 1967, pp. 390-396.

Ting, Shang-Kee et al., "An Algorithm to Compensate the Effects of Spurious PLL Tones in Spectrum Sensing Architectures", IEEE Transactions on Circuits and Systems, I: Regular Papers, vol. 59, No. 5, May 1, 2012, pp. 1093-1106.

Jamal, Shafiq M. et al., "Calibration of Sample-Time Error in a Two-Channel Time-Interleaved Analog-to-Digital Converter," IEEE Transactions on Circuits and Systems, I: Regular Papers, vol. 51, No. 1, Jan. 1, 2004, pp. 130-139.

Marple, S. Lawrence Jr., "Computing the Discrete-Time 'Analytic' Signal via FFT," IEEE Transactions on Signal Processing, vol. 47, No. 9, Sep. 1, 1999, pp. 2600-2603.

* cited by examiner

TEST EQUIPMENT, METHOD FOR OPERATING A TEST EQUIPMENT AND COMPUTER PROGRAM

CROSS-REFERENCE TO RELATED APPLICATION

This application is a continuation of copending International Application No. PCT/EP2014/079267, filed Dec. 23, 2014, which is incorporated herein by reference in its entirety.

BACKGROUND OF THE INVENTION

Embodiments of the present application refer to a test equipment, comprising a user-site calibration unit, a method for operating a test equipment and a corresponding computer program. Embodiments refer to a hardware architecture and software method for the AC-calibration of a high bandwidth analog IO-pin of an automated test equipment.

As with digital pins in automated test equipment (ATE) the analog pins follow the trend of a "per-pin-architecture" and become configurable IO pins. This means they provide both capabilities of either sourcing or capturing analog signals. When sourcing analog signals the analog IO pin behaves like an arbitrary waveform generator (AWG) and when capturing analog signals the analog IO pin behaves like a digitizer (DTZ) and digitizes analog data for comparison against expected digital data in the time or frequency domain.

The AWG portion of such an analog pin (in the following called an analog channel) is typically composed of a digital-to-analog converter (DAC), bandwidth limiting filters and an amplifier stage for ranging and offset control. The DTZ portion of an analog channel is typically composed of an input termination stage, an amplifier stage for ranging and offset control, bandwidth limiting filters and an analog-to-digital converter (ADC). The digital interfacing of both, the DAC of the AWG and the ADC of the DTZ are connected to a digital signal processor that is able to perform hardware based real-time signal processing on the signal data represented digitally. The signal processor finally transfers the digital data between the hardware channel and the IO interface of a workstation or vice versa. The workstation runs ATE software on the workstation processor for configuring and control of the ATE pins and other tester hardware. This software performs further post-processing on data received from the DTZ and performs the desired tests on it. This software also performs preprocessing of data that will be sent to the AWG for waveform generation.

The characteristic of the analog portion of both, the AWG as well as the DTZ including the converters is typically specified in terms of a frequency characteristic showing both the gain and the phase in dependency of the frequency together with key frequency domain performance parameters such as total harmonic distortion (THD), signal-to-noise-ratio (SNR) and spurious free dynamic range (SFDR).

An inherent expectation for such a flexible analog IO pin is a flat frequency characteristic regardless if it is configured as AWG or DTZ. The frequency characteristic should be independent of the gain and offset settings. This means that the amplitude of a spectrally pure sine wave propagates through either type of analog channel, DTZ or AWG, independent of the frequency of the sine wave and independent of the sample rate chosen for conversion, as long as this frequency lies in the pass band of the configured bandwidth limiting filters. In the stop band the expectation is that any spectral component will be significantly attenuated according to a specification. Between pass band and stop band the expectation is a soft transition without any discontinuities.

In reality the ideal expectation of a flat frequency response cannot be met. The reason is the presence of various parasitic effects and inaccuracies in the used semiconductors and passive parts in the analog signal paths as well as the non-ideal signal propagation on the traces and planes of the used PCB. Therefore the frequency characteristic of the DTZ and AWG channel does not only show gain deviations with respect to DC but also gain deviations depending on frequency. Typically the frequency characteristic shows a certain ripple in the pass band potentially superimposed to either a peaking or a falling slope in the pass band. In the stop band it typically shows an attenuation that is neither constant nor monotonously increasing.

For simulation purposes and the simplified description of the system, the frequency characteristic of an analog IO channel can be modeled like a conventional low pass with ripples such as a Chebyshev or Butterworth low pass that behaves linearly followed by an ideal ADC (DTZ) or preceded by a DAC (AWG).

The presence of means for digital processing in terms of a processor on a channel board of the ATE (test processor) or a processor in the workstation suggests that the deviation of an ideal behavior is compensated by either pre-distortion of AWG data during signal generation or equalization of data during capturing by the DTZ. The requirement for such a compensation to work properly is the provisioning of a hardware architecture that allows the measurement of the deviation from the ideal behavior and further allows the compensation to be executed according to the deviation with minimum overhead and cost. Since all steps of this compensation concept should advantageously, but not necessarily, run automatically with the purpose of an ideal outcome in the frequency domain. Therefore this compensation procedure can also be referred to as an automated AC calibration.

Particularly the cost of test is a major goal for designing ATE that imposes certain limits on the strategy of AC calibration. One contributor for low cost of test is a high parallelism of tester resources. As a consequence the pin density needs to be maximized. In turn, the high pin density typically entails a high degree of integration and the minimizing of components on the pin electronic cards. Since calibration is an add-on to the regular pin functionality the provisioning is contra-productive with respect to minimizing the footprint of a pin electronic channel. Therefore AC-calibration should add only a very minimum of extra floor-space on a pin-electronic PCB and its cost should be very well justified with the improvements in performance it brings about.

Two types of calibration procedures have to be distinguished: Factory calibration and user calibration. Whereas factory calibration is performed once after manufacturing in the factory or during factory service and repair the user calibration can be repeated on the users test floor whenever it is appropriate. Due to the fact that electronic components can change their behavior over time and over environmental conditions a user calibration is of advantage. However the cost penalty is larger for the user calibration since measurement means to determine the deviation from ideality need to be put on the board. For factory calibration the effort is much higher but the achievable accuracy is also higher due to more precise external equipment that can be used. Therefore a hybrid approach is typically chosen, that contains a certain amount of factory calibration especially for minimized measurement resources on the channel PCB and a user calibration that makes use of these calibrated but minimized on-board resources for calibrating the individual channels during user calibration.

According to a State-of-the-Art approach, AC calibration can be achieved in the time or in the frequency domain. Since most ATE is equipped with digital signal processing capabilities, it is obvious to perform the compensation with digital filtering using either a real time signal processing unit implemented in hardware or to have the ATE software running on a workstation or a digital signal processor to perform the digital filtering.

The compensation filter properties may be determined during a factory calibration by measuring the impulse response of an analog channel in the time domain. The impulse response represents the channel specific frequency characteristic in the time domain and it can be also converted in the frequency domain. Since the goal is a flat magnitude response the frequency compensation function in an ideal case is just the inverse (1/x operation) of the Fourier transformed impulse response. Just the magnitude has to be taken into account and an arbitrary linear phase may be added to help implementation of the final FIR compensation filter in the signal processing unit. When the frequency compensation function is transformed back into the time domain the resulting compensation impulse response can be sampled with an appropriate sampling rate, and the samples can be used as coefficients for the digital FIR compensation filter. In this concept, the compensation filter coefficients determined after manufacturing can be stored in a non-volatile memory during the factory calibration and therefore travel with the pin electronic board. An equivalent approach is to perform the measurement of the frequency characteristic of the analog channel in the frequency domain using a network analyzer followed by a Fourier transform to obtain the impulse response of the channel. Finally all the compensation operation can at least theoretically also be performed in the frequency domain when the Fourier transform of the data that need to be compensated can be executed fast enough by a signal processing unit.

A major drawback of both concepts mentioned above is the high effort for the measurement of the frequency characteristic per channel using instruments such as an oscilloscope or a network analyzer. Furthermore, the fact that this concept includes a factory calibration, means that re-calibration only can be performed completely when service personnel disassembles the ATE, exchanges the channel board and sends it back to the factory for calibration.

Therefore, there is the need for an improved approach. The objective of the present application is to enable a user-site calibration technique having improved performance while consuming less resources.

SUMMARY

An embodiment may have test equipment, having a signal input/signal output, configured to receive and/or transmit an actual electrical signal, and an user-site calibration unit for determining an user-site compensation function having a compensation magnitude function and a compensation Hilbert phase function, the user-site calibration unit having: an level meter configured to measure a magnitude characteristic of the electrical signal, the magnitude characteristic being the basis for the determination of the compensation Hilbert phase function; and a calculator configured to determine a Hilbert phase characteristic of the electrical signal based on a Hilbert transformation of a function dependent on the measured magnitude characteristic and to determine the compensation Hilbert phase function on the basis of the Hilbert phase characteristic.

Another embodiment may have a method for operating a test equipment, having the step of determining an user-site compensation function having a compensation magnitude function and a compensation Hilbert phase function, using an user-site calibration unit, having the sub-steps of: receiving and/or transmitting an actual electrical signal; measuring a magnitude characteristic of the electrical signal being the basis for the determination of the compensation Hilbert phase function; and determining a Hilbert phase characteristic of the electrical signal on the basis of a Hilbert Transformation of a function dependent on the measured magnitude characteristic.

Another embodiment may have a non-transitory digital storage medium having stored thereon a computer program for performing the above method for operating a test equipment, when said computer program is run by a computer.

Still another embodiment may have test equipment, having an user-site calibration unit for determining an user-site compensation function having a compensation magnitude function and a compensation Hilbert phase function, the user-site calibration unit having: a signal input/signal output configured to receive and/or transmit an actual electrical signal; an level meter configured to measure a magnitude characteristic of the electrical signal, the magnitude characteristic being the basis for the determination of the compensation phase function; and a calculator configured to determine a phase characteristic of the electrical signal based on a linear phase transformation of the function dependent on the measured magnitude characteristic and to determine the compensation phase function on the basis of the phase characteristic.

An embodiment provides a test equipment. The test equipment comprises a signal input/signal output, configured to receive and/or transmit an actual signal, and uses that calibration unit for determining a user site compensation function comprising a compensation magnitude function and a compensation Hilbert phase function. The user-site calibration unit comprises a level meter and a calculator. The level meter is configured to measure a magnitude characteristic of the electrical signal, the magnitude characteristic being the basis for the determination of the compensation Hilbert phase function. The calculator is configured to determine a Hilbert phase characteristic of the electrical signal based on a Hilbert transformation of a function dependent on the measured magnitude characteristic and to determine the compensation Hilbert phase function on the basis of the Hilbert phase characteristic.

Teachings of the present invention are based on the recognition that it is sufficient for a calibration, which typically entails the determination of a magnitude characteristic and a phase characteristic, to determine the magnitude characteristic and to calculate the phase characteristic. For the calculation of the phase characteristic the Hilbert phase transformation is beneficial, since it consumes less resources and enables a sufficiently accurate calculation of the phase (Hilbert phase). Therefore, embodiments of the present invention are based on the principle of calculating the Hilbert phase based on a Hilbert phase transformation algorithm, wherein a measurement performed by using a level meter forms the basis of the calculation. A typical Hilbert phase transformation algorithm outputs two possible results for the Hilbert phase, wherein the magnitude characteristic measured by using the level meter enables selecting the one right Hilbert phase. Regarding the calibration, it should be noted that the calibration may be used for a test equipment outputting a signal or receiving a signal in order to calibrate the signal output or the signal input. A test equipment or, in more detail, the user-site calibration unit for a test equipment using the above principles is beneficial, since it minimizes the effort for external measurement equipment during factory calibration. Furthermore, just the onboard level meter is calibrated with respect to measuring the signal magnitude. Additionally, it minimizes cost and PC board space for on-board measurement means to achieve user calibration. The highly integrated level meter keep the extra board space and circuit overhead small.

According to a further embodiment, the compensation magnitude function as well as the compensation Hilbert phase function form a target filter function. In detail, the compensation magnitude function is a quotient of the magnitude characteristic of the target filter function and a measured magnitude characteristics. Based on this compensation magnitude function the function for the determination of the Hilbert phase function may be calculated. In embodiments, this function complies with the compensation magnitude function. The use of a target calibration goal in terms of an maximally flat Butterworth characteristic is immediately understandable by customers and makes the instrument behave like a realistic and implementable filter system. The target transition band as well as the stop band behavior is close enough to a how the uncalibrated system behaves and yields a reasonable and stable compensation function.

According to a further embodiment, the calculator determines the Hilbert phase function by calculating an equation system comprising the compensation magnitude function and the complementing compensation Hilbert phase function. This so called compensation equation system has two possible solutions, wherein the compensation equation system is solvable using a causality condition for the compensation equation system. This causality condition is true if the impulse response of the compensation equation system for a point of time before receiving the actual electrical signal is zero. The calculation of the complementing phase for the compensation magnitude function automatically ensures causality for the whole system. Causality is as expected for a real system. With respect to the generation of FIR filter coefficients causality has the big advantage that limitations in the number of coefficients will only effect those portions of the impulse response that appear after a certain positive time has elapsed. This inherently helps to keep the number of coefficients small while minimizing the errors when truncation or windowing is done on the positive end of the impulse response.

According to a further embodiment, the causality condition under the condition that $$\mathrm{Im}H_k(f) = -\frac{1}{\pi}\int_{-\infty}^{+\infty}\frac{\mathrm{Re}H_k(u)}{f-u}du = -\mathcal{H}\{\mathrm{Re}H_k(f)\}$$

and $$\mathrm{Re}H_k(f) = +\frac{1}{\pi}\int_{-\infty}^{+\infty}\frac{\mathrm{Im}H_k(u)}{f-u}du = +\mathcal{H}\{\mathrm{Im}H_k(f)\}.$$

According to further embodiments, the above discussed Hilbert transformation may be calculated as follows: $se(t)=0.5*(s(t)+s(-t))$, for the even time domain function corresponding to the real portion of the frequency characteristic of the actual electrical signal, and $so(t)=0.5*(s(t)-s(-t))$ for the odd time domain function corresponding to the imaginary portion of the frequency characteristic of the actual electrical signal. Here, the sign function +1 for t>0, −1 for t<0 is used to transform the even domain function in the odd time domain function. As can be seen, the compensation functions are frequency-dependent functions.

As discussed above, the calibration process performed by the user-site calibration unit has the aim to define user-site filter coefficients (cf. user-site calibration data or user-site compensation function). The user-site filter coefficients may be filter coefficient calculated from sampling the causal impulse response of the compensation equation system obtained by inversely Fourier transforming the user-site compensation function.

In order to apply the filter coefficients to the test equipment, the text equipment may, according to further embodiments, comprise a factory-site compensation unit comprising a memory, having stored thereon a factory-site compensation function, and a digital signal processor coupled to the signal input/signal output and configured to process—in a first stage—an electrical signal (received or transmitted via the signal input/signal output) using the factory-site compensation function. As a consequence, the above discussed level meter measures the magnitude characteristic of the processed electrical signal forming the basis for the determination of the filter coefficients. Furthermore, the digital signal processor is configured to process—in a second stage after determining the user-site compensation function—the electrical signal using the user-site compensation function. That means that the signal processor processes the electrical signal based on the factory-site compensation function and the user-site compensation function and enables a gain and a phase related compensation of the electrical signal. Consequently, the flatness compensation functionality can easily be implemented in a real time signal processing unit also available per IO pin in terms of a digital FIR compensation filter. The flatness compensation functionality can even be combined with other filtering functionalities such as a compensation for a CIC decimation filter implemented in the same integrated circuit component. When the flatness compensation is performed on a per pin hardware basis for many analog IO pins in the ATE processing a significant load is relieved from the centralized workstation process.

According to a further embodiment, a signal input/signal output comprises a switching matrix configured the connect a first signal processing path comprising a DAC and/or a second signal processing path comprising an ADC and/or the level meter selectively to the signal input/signal output. Here, the signal input/signal output and consequently the switching matrix may be configured for differential signal processing. The use of highly integrated IO switching matrix elements like MEMS elements at the signal input/signal output keep the extra board space and circuit overhead small.

A further embodiment provides a method for operating a test equipment. The method comprises the steps of determining a user-site compensation function comprising a compensation magnitude function and a compensation Hilbert phase function, using a user-site calibration unit. This steps comprises the sub-steps of receiving and/or transmitting an actual electrical signal, measuring a magnitude characteristic of the electrical signal being the basis for the determination of the compensation Hilbert phase function and determining a Hilbert phase characteristic of the electrical signal on the basis of a Hilbert transformation of a function dependent on the measured magnitude characteristic.

A further embodiments provides a corresponding computer program performing the above method.

According to a further embodiment, the test equipment comprising a user-site calibration unit for determining a user-site compensation function comprises additionally or alternatively a calculator configured to determine a phase characteristic of the electrical signal based on a linear phase transformation of the function dependent on the measured magnitude characteristic and to determine the compensation phase function on the basis of the phase characteristic. That is, the linear phase transformation is used instead of the Hilbert transformation and the compensation phase function is used instead of the compensation Hilbert phase function.

BRIEF DESCRIPTION OF THE DRAWINGS

Embodiments of the present invention will be discussed with respect to the enclosed drawings. Here.

DETAILED DESCRIPTION OF THE INVENTION

Below, embodiments of the present invention will subsequently be discussed referring to the enclosed figures, wherein reference numbers are provided to elements in order to illustrate the linkage between the description below and the enclosed figures. Identical reference numbers are provided to elements having an identical or similar function so that the description thereof is mutually applicable or interchangeable.

Figure 1:
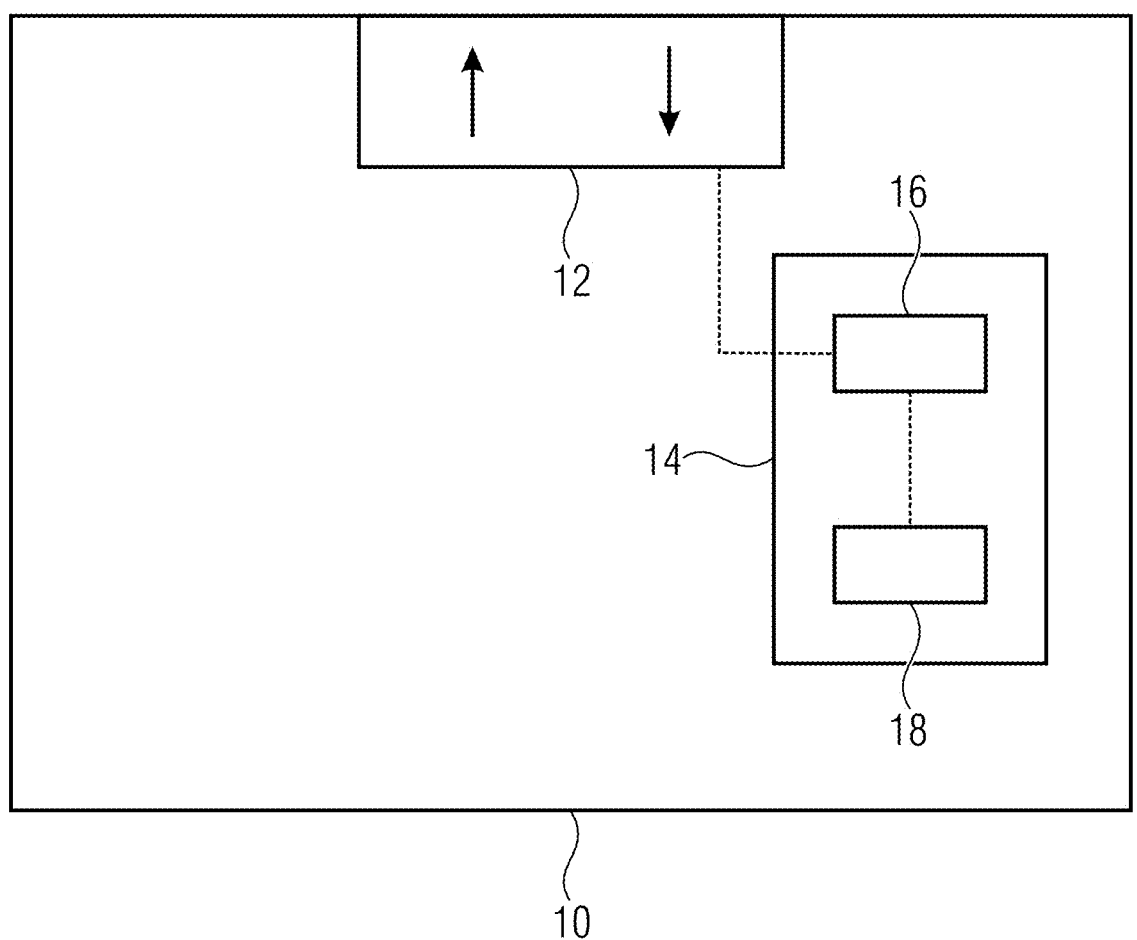
FIG. 1 shows a schematic block diagram of a user-site calibration unit of a test equipment according to a first embodiment.

FIG. 1 shows a test equipment 10 comprising an analog signal input/signal output 12 and a user-site calibration unit 14. The user-site calibration unit 14 comprises two entities, namely the level meter 16 and the calculator 18.

The signal input/signal output 12 is a common entity of a test equipment and has the purpose to receive and/or transmit an actual electrical signal. That is, the signal input/signal output 12 may also only be an input or an output. The actual electrical signal received and/or transmitted via the signal input/signal output 12 is analyzed using the level meter 16. In detail, the level meter 16 is configured to measure a magnitude characteristic of the electrical signal. This magnitude characteristic is the basis for the determination of the compensation magnitude function as well as of the determination (calculation) of the compensation Hilbert phase function. Starting from the determined magnitude characteristic the calculator 18 determines the Hilbert phase characteristic of the electrical signal based on a so called Hilbert transformation of a function dependent on the measured magnitude characteristic. Furthermore, the calculator 18 is configured to determine the compensation Hilbert phase function based on the Hilbert phase characteristic.

The target function $H_{target}(f)$ may be defined as $H_{target}(f)=H_{channel}(f)*H_{compensation}(f)$.

Consequently, $H_{compensation}(f)=H_{target}(f)/H_{channel}(f)$.

For example, if $H_{target}(f)=H_{butterworth}(f)$, then $H_{butterworth}(f)$ is a maximally flat behavior, this is the desired behavior. The application of compensation results in: $H_{system}(f)=H_{channel}(f)*H_{compensation}(f)=H_{channel}(f)*H_{target}(f)/H_{channel}(f)=H_{target}(f)$. The result thereof is $H_{target}(f)=H_{butterworth}(f)$ and this is what the customer wants.

The detailed calculation will be described with respect to FIG. 4. Before discussing further implementations of the test equipment, the method for calibrating will be discussed:

1) Starting from an existing magnitude characteristic of the channel $|H_{channel}(f)|$ which is measured on the board as manufactured (initial step).
2) After that, the target magnitude characteristic is determined, for example, as Butterworth characteristic, i.e. $|H_{target}(f)|=|H_{butterworth}(f)|$.
3) The magnitude of the compensation function is determined: $|H_{compensation}(f)|=|H_{target}(f)|/|H_{channel}(f)|$.
4) Starting from the determined compensation function, the phase of the compensation function is calculated with Hilbert: Phase (basic step): $(H_{compensation}(f))$=Hilbert$(|H_{compensation}(f)|)$.
5) After that, the compensation may be applied to the channel: $H_{system}(f)=H_{channel}(f)*H_{compensation}(f)$.
6) The above compensation ensures that: $|H_{system}(f)|=|H_{butterworth}(f)|$. This does not force Phase($H_{system}(f)$) to a predefined function. The resulting phase will rather be defined by the causality of the system, since $h_{compensation}(t)$ is forced to be causal by the Hilbert transform and $h_{channel}(t)$ is inherently causal because it is measured reality, thus $h_{system}(t)$ is causal.

Alternatively it is possible to use Phase($H_{compensation}(f)$)=linear phase function (f) instead of calculating the Hilbert transform (=second embodiment). This also does not force Phase($H_{system}(f)$) to a predefined function. But the resulting phase will be non-causal since in that case $h_{compensation}(t)$ is not causal and therefore $h_{system}(t)$ is not causal.

Figure 2:
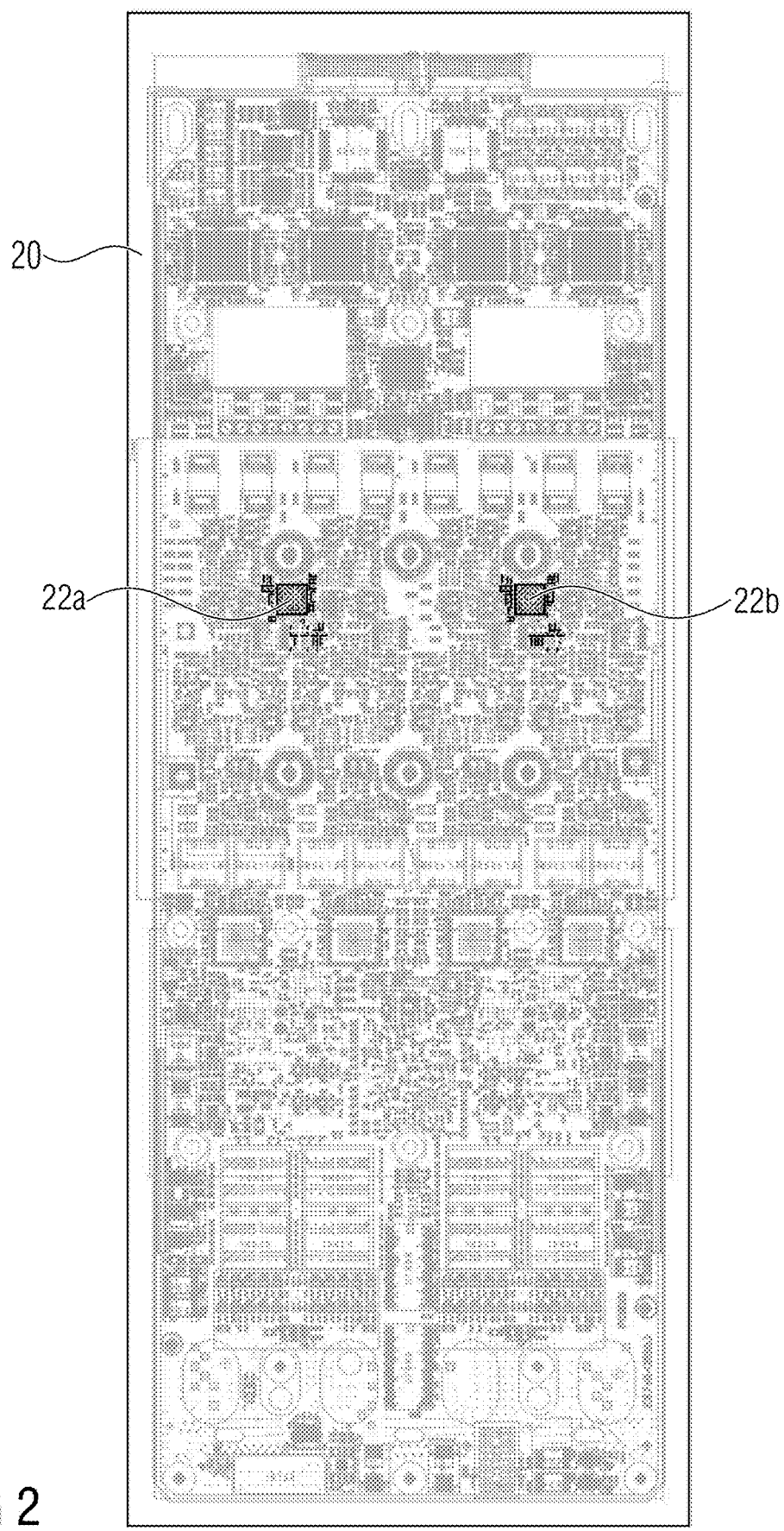
FIG. 2 shows an exemplary implementation of the test equipment.

FIG. 2 shows an exemplary implementation of the test equipment. Here, the layout of the Numerobis mixed signal 4 channel board 20 of an automated test equipment (ATE) is illustrated. The two level meters 22a and 22b are highlighted.

Level meters 22a, 22b are highly integrated semiconductor devices that measure true rms power of a signal regardless of its waveform. Therefore they consume just a small fraction of the board space. FIG. 2 shows the board space consumed by the two level meters 22a, 22b used on the Numerobis 4 IO channel mixed signal board 20 for factory calibration. However, the information obtained from a level meter 22a, 22b is just magnitude information. This means measuring with spectrally pure sinusoidal signals at different frequencies as stimulus just yields the magnitude of the respective frequency characteristic. An essential aspect of the invention is that the Hilbert transform can be used to calculate appropriate phase information under the prerequisite that the compensation signal is causal.

A compensation that is able to finally have the instrument characteristic to behave like a maximally flat Butterworth filter would normally entail the measurement of phase or group delay information during factory calibration. Such a measurement is hardly possibly on-board keeping the channel density at the same level. Substituting just a linear phase would cause a non-causal behavior. However, an implementation as described in this invention disclosure would also allow the substitution of the Hilbert phase calculation with a linear phase.

Figure 3:
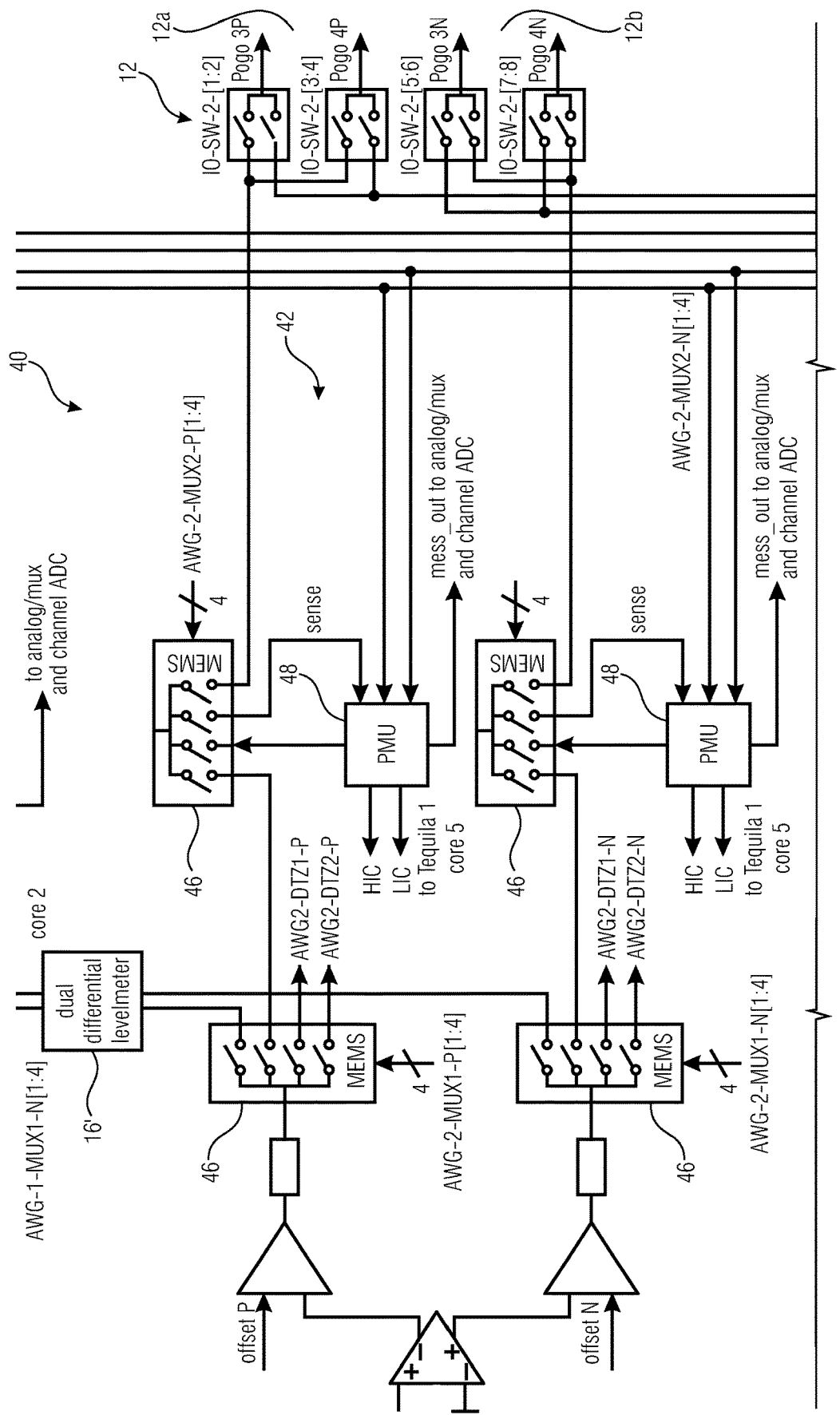
FIG. 3 shows a schematic implementation of the signal input/signal output realized as an IO switching matrix used in the text equipment according to embodiments.
Figure 3:
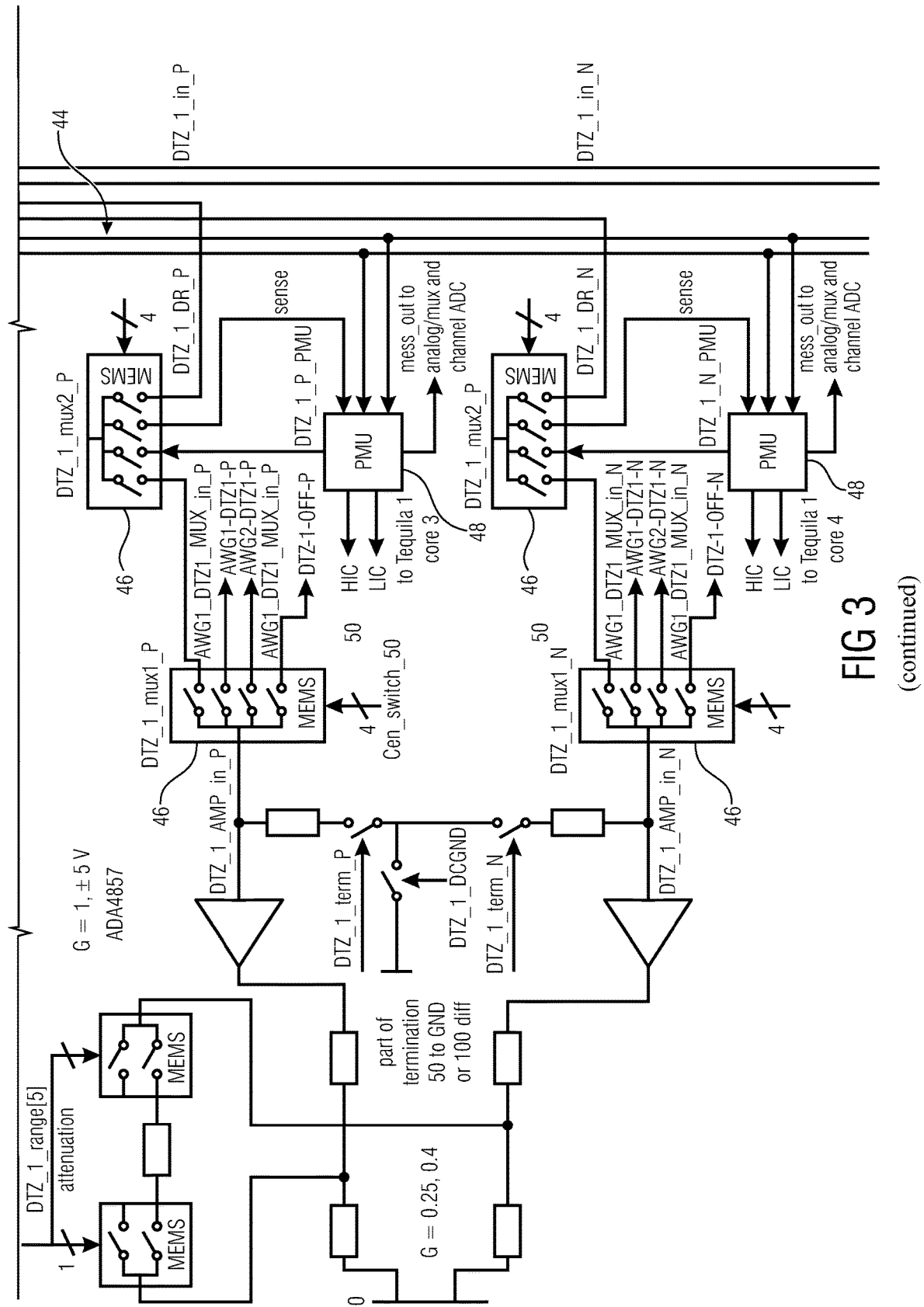

FIG. 3 shows a schematic representation of an implementation of the IO switching matrix 40, here implemented on the Numerobis mixed signal board. The switching matrix comprises, in the basic configuration, at least the signal input/signal output entity 12. This signal input/signal output entity 12 comprises a plurality of switches, such that the plurality of inputs/outputs 12a and 12b (pogo connectors), which are realized as differential inputs/differential outputs, may be coupled to the different input and output stages of the switching matrix 40. In this embodiment, the switching matrix 40 is a differential output structure comprising a first differential channel 42 (AWG channel) and a second differential output channel 44 (DTZ channel). Each channel 42 and 44 comprises two four-to-one multiplex switching devices 46 per signal line, i.e. eight four-to-one multiplex switching devices 46. Furthermore, each signal line is coupled to a parametric measurement unit (PMU) 48. The differential output of the channel 42 is may be coupled to a differential level meter 16' using two four-to-one multiplex switches 46. The first channel 42 (AVG) channel as well as the second (DTZ) channel comprise a plurality of amplifiers, wherein the structure of the channel 42 differs from the structure of the channel 44, as will be discussed below.

Due to the newly available MEMS technology very small form factor MEMS relays are available on the market substantially simplifying the design of an IO switching matrix 40 under severe area constraints. Four-to-one multiplexer switching devices 46 are available in a package with a footprint less of than 5×5 mm². Using such MEMS relays a structure of the IO matrix 40 as used for the calibration concept described in this invention still is feasible while keeping the channel density goals.

The IO switching matrix 40 schematic shows a differential output structure of one AWG channel 42 and its interconnect to the differential DTZ channel 44 as well as the connectivity to the level meter 16' and DC resources such as the parametric measurement unit 48 (PMU). Each differential pogo connection 12a, 12b can be routed via a first multiplexer to either a DTZ 44 or an AWG 42 channel, the DC rail, a PMU 48 or a second multiplexer. By means of the second multiplexer the output of the AWG channel 42 can be routed to either the level meter 16', the first multiplexer or to two different DTZ channels 44. The same connectivity is available on a DTZ channel 44 except that the DTZ input can be routed to either the first multiplexer or to two different AWG channels 42 or to an DTZ offset DAC.

This IO switching matrix structure 40 in a first factory calibration step allows to calibrate the level meter 16' with respect to sinusoidal signal magnitude to external equipment connected to the pogo pins 12a, 12b. In a second user calibration step, the AWG output is connected to the factory calibrated level meter via the second multiplexer. This way the AWG will be calibrated with respect to sinusoidal signal magnitude to the user calibrated level meter.

In a further user calibration step, the AWG output is connected to a DTZ input via the second multiplexer. This way the DTZ will be calibrated with respect to sinusoidal signal magnitude using the user calibrated AWG channel 42.

The compensation magnitude function may be calculated as following: The result of the AWG and DTZ user calibration step is a magnitude frequency characteristic of each instrument channel for each internal filter setting. For each measured magnitude filter setting of each instrument channel an appropriate maximally flat Butterworth filter or other frequency domain characteristic setting is selected. The filter setting is selected with respect to the specified filter order and the specified filter bandwidth. A magnitude compensation function is then calculated from the quotient of the maximally flat Butterworth filter characteristic and the measured magnitude frequency characteristic of the instrument channel as a target compensation goal, i.e. compensation=target/measured channel. According to the implementation of the invention any other appropriate target frequency characteristic may be chosen as well.

When now the total system frequency characteristic of the compensated instrument is calculated, the product of the instrument channel magnitude frequency characteristic and the compensation magnitude frequency characteristic has to be formed. In this product the influence of the instrument channel magnitude response cancels out and only the target magnitude characteristic appears as a result. However, in such a calculation any phase information is missing.

Figure 4A:
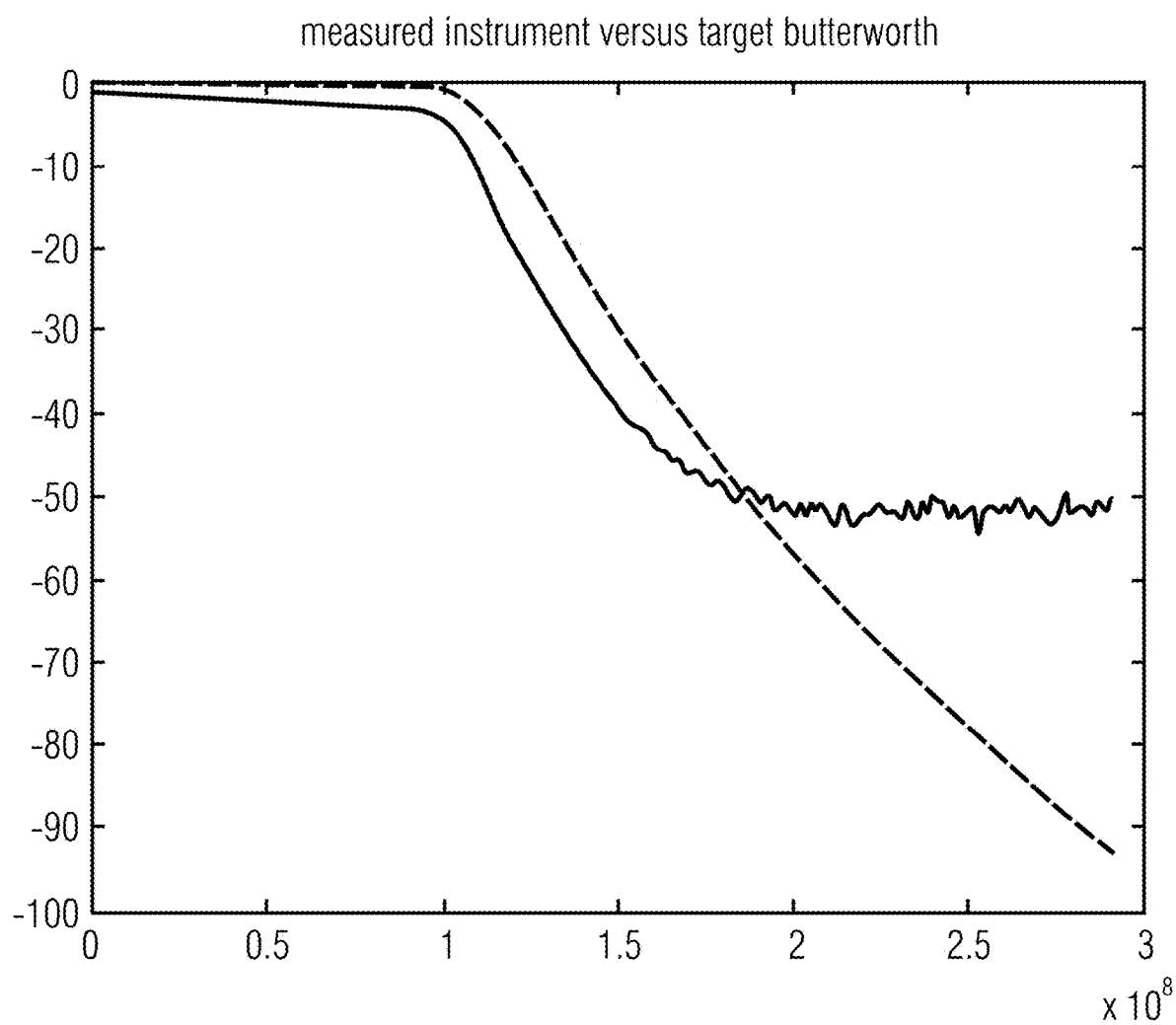
FIGS. 4a-4j show schematic diagrams of impulse responses and functions for illustrating the background of the invention.

In the following graph an example for the Numerobis mixed signal IO channel is given (FIG. 4a). The graph shows the measured transfer characteristics of an uncalibrated DTZ channel with the 100 MHz low-pass filter turned on (solid trace). The y-axis shows the magnitude gain in decibels. The x-axis shows the frequency in Hz. The dashed trace in the graph shows the compensation target transfer characteristic that is a maximally flat Butterworth filter characteristic. The Butterworth filter order of 11 was chosen according to the fact that the designed instrument filter type is a Chebychev type of order 9. To get an equally steep transition for the compensation target transfer characteristic of Butterworth type a delta of two in the filter order is used. The corner frequency of the target Butterworth characteristic was set to 110 MHz instead of 100 MHz as used for the designed instrument Chebyshev filter characteristic. This small increase of about 10% in bandwidth turned out to be reasonable to ensure that the compensation function that is taken from the quotient of the Butterworth and Chebychev characteristics does not show too much of a peaking in the magnitude characteristic.

FIG. 4a shows a measured transfer characteristic of an uncalibrated DTZ channel (solid line) and the target transfer characteristic of maximally flat Butterworth type (dashed line)

Figure 4B:
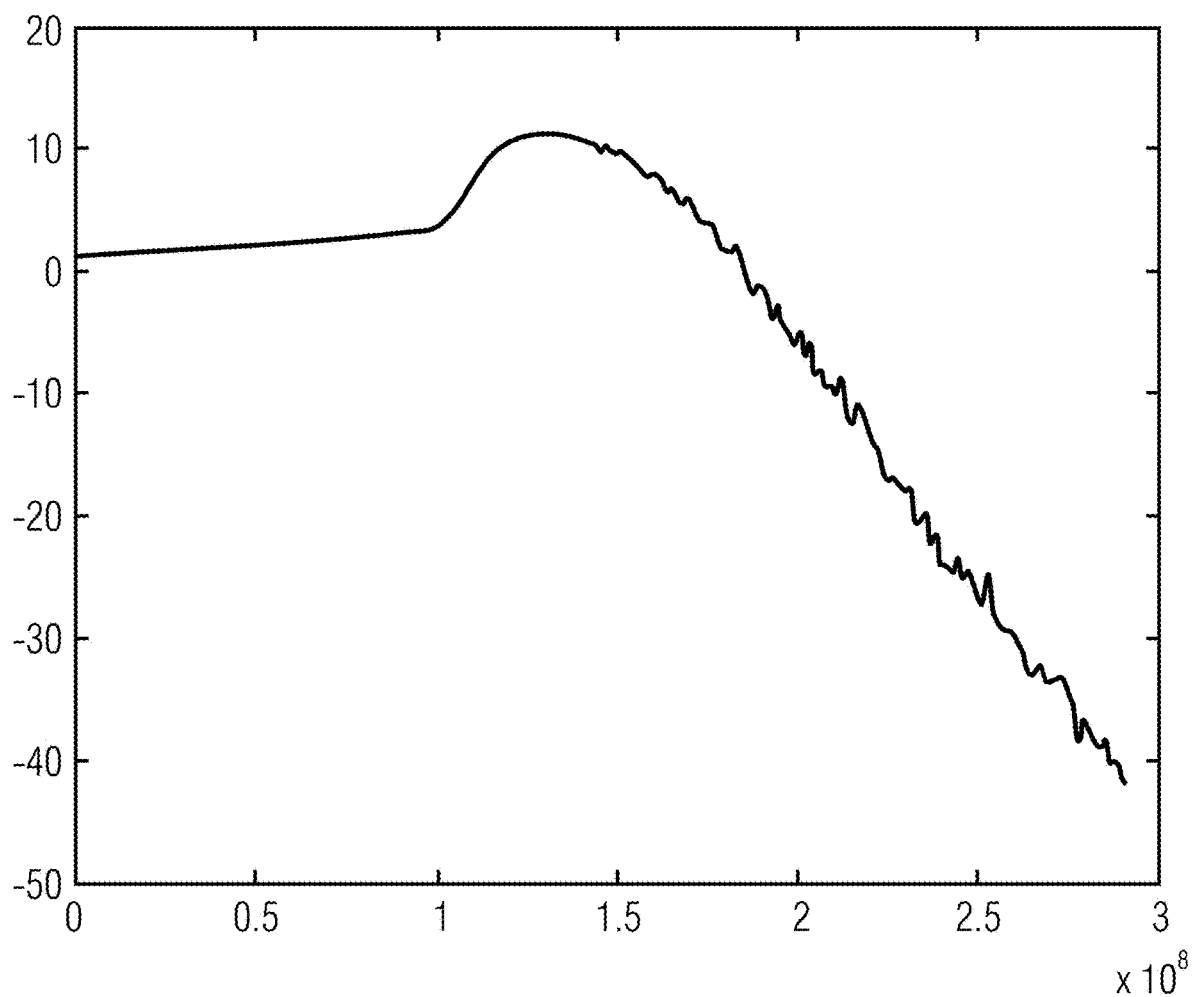

FIG. 4b shows the resulting magnitude compensation function that is the quotient of both, the magnitude of the target maximally flat Butterworth characteristic and the measured instrument magnitude characteristic as a result of the level meter measurement. According to the invention the compensation algorithm that calculates the magnitude compensation function as in FIG. 4b ensures that neither the peaking here at about 120 MHz nor the trend of the compensation characteristic between the target corner frequency and the highest frequency of the compensation calculation is exceeding a certain span. A software regulation loop adjusts the target corner frequency and the filter order such that the criteria for the peaking or ripple and for the transition/stop band trend are met. When these criteria are met then the impulse response of the compensation function as a result of the overall algorithm will be limited in duration. As a consequence, the number of FIR filter coefficients (taps) will be limited to an acceptable minimum.

Complementing the magnitude information with a suitable phase for the compensated system: At first, the use of a level meter to just measure the magnitude characteristic for calibration of an IO channel seems to be insufficient for the purpose of AC flatness calibration, since appropriate phase information is crucial for calculating a suitable impulse response for the determination of compensation FIR filter coefficients. The FIR filter coefficients for the compensation filter are determined from sampling the impulse response obtained from the inverse Fourier transformation of the compensation function.

In known technology, it can be found that compensation of a frequency characteristic is done by just substituting a linear phase when only magnitude information is available. The disadvantage of this approach is found in the fact that a linear phase causes a non-causal impulse response that is shifted on the time axis with a given delay reflecting the linear phase. The linear phase implies a symmetric impulse response that extends from the impulse response maximum to the negative and the positive time direction in equal manner towards positive and negative infinity.

As a result of the fact that a symmetric impulse response also extends to the infinite negative time axis a clipping at time zero or a windowing is used to force the impulse response to zero for t<0 such that the compensation FIR filter can work with samples at positive time, as it is set by its architecture.

The invention however relies on the fact that causality may be assumed for the impulse response of the instruments time domain characteristic. Causality means that the impulse response is zero for t<0 or in other words, the instrument does not produce a signal for a time that occurs before the impulse stimulus occurs. This assumption leads to a strict mathematical relationship between the real and the imaginary portions of the compensation function (entailed) or, what is equivalent, between the magnitude and the phase of the compensation function. This mathematical relationship is expressed in the Hilbert transform pairs of magnitude and phase in the Fourier transform of a causal impulse response. In the frequency domain the Hilbert transform is an integral transform function. In the time domain, according to Fourier theory, the Hilbert transform represents the convolution with the so-called signum function.

$$\mathrm{Im}H_k(f) = -\frac{1}{\pi}\int_{-\infty}^{+\infty}\frac{\mathrm{Re}H_k(u)}{f-u}du = -\mathcal{H}\{\mathrm{Re}H_k(f)\}$$

$$\mathrm{Re}H_k(f) = +\frac{1}{\pi}\int_{-\infty}^{+\infty}\frac{\mathrm{Im}H_k(u)}{f-u}du = +\mathcal{H}\{\mathrm{Im}H_k(f)\}$$

The Hilbert transform pair that relates the real and the imaginary part of a frequency characteristic of a causal system.

This means in the implementation of the invention the Hilbert transform of the magnitude compensation function is used to generate the missing phase information. The use of the Hilbert transform is justified by the fact that the resulting impulse response that describes the compensation function in the time domain is expected to be causal. Or in other words the causality assumption enables the reconstruction of the missing phase information from the level meter measurement.

The mathematical calculation of the Hilbert transform to obtain the phase from the magnitude is symbolically described with the following Matlab code snippet (using the Matlab math software package from The MathWorks Inc.):
% compensation magnitude $H\_f2\mathrm{abs}=\mathrm{abs}(H\_f2);$ $H\_f3\mathrm{abs}=\mathrm{abs}(H\_f3);$ $H\_f\mathrm{comp}=H\_f3\mathrm{abs}./H\_f2\mathrm{abs};$ % add Hilbert phase for causality $H\mathrm{arg}=\mathrm{imag}(\mathrm{hilbert}(-\mathrm{log}(H\_f\mathrm{comp})));$ $H\_f4=H\_f\mathrm{comp}.*\mathrm{exp}(1i*H\mathrm{arg});$ In this code snippet H_f3 represents the target maximally flat Butterworth magnitude characteristic in terms of a frequency discrete sample array. H_f2 represents the measured magnitude frequency characteristic of the instrument in terms of a frequency discrete sample array. The compensation function is obtained by an element-wise array (matrix-) division. Since the mathematically well-defined Hilbert transform is typically available as a transform between real and imaginary parts of a complex matrix in regular software math libraries, a magnitude attenuation function a(f) is assumed that is the negative logarithm of the actual magnitude A(f) such that exponentiation yields the actual magnitude again:

$a(f)=-\mathrm{ln}(A(f))$ $\mathrm{exp}(-a(f))=A(f)$

By this means can be expressed a complex frequency characteristic given in magnitude and phase $H(f)=A(f)*\mathrm{exp}(-i\varphi(f))$ also expressed purely with an exponential function:

$H(f)=\mathrm{exp}(-a(f)-i\varphi(f))=\mathrm{exp}(-\gamma(f))$

Now it can be considered the exponent as a complex attenuation function γ(f) for which the result is:

$\gamma(f)=a(f)+i\varphi(f)$

In this complex attenuation function γ(f), real part and imaginary part represent the actual phase and the negative logarithm of the magnitude, that are interlinked through the regular Hilbert transform, as defined in most math software packages, when assumed H(f) is determined to be causal.

Therefore, in the code snippet, the line:

$H\mathrm{arg}=\mathrm{imag}(\mathrm{hilbert}(-\mathrm{log}(H\_f\mathrm{comp})));$ produces the Hilbert phase Harg to the given magnitude of the compensation function. Now, the magnitude of the compensation function H_fcomp can be complemented with its corresponding Hilbert phase Harg to form the complex compensation function H_f4 according to the following line:

$H\_f4=H\_f\mathrm{comp}.*\mathrm{exp}(1i*H\mathrm{arg});$

Figure 4C:
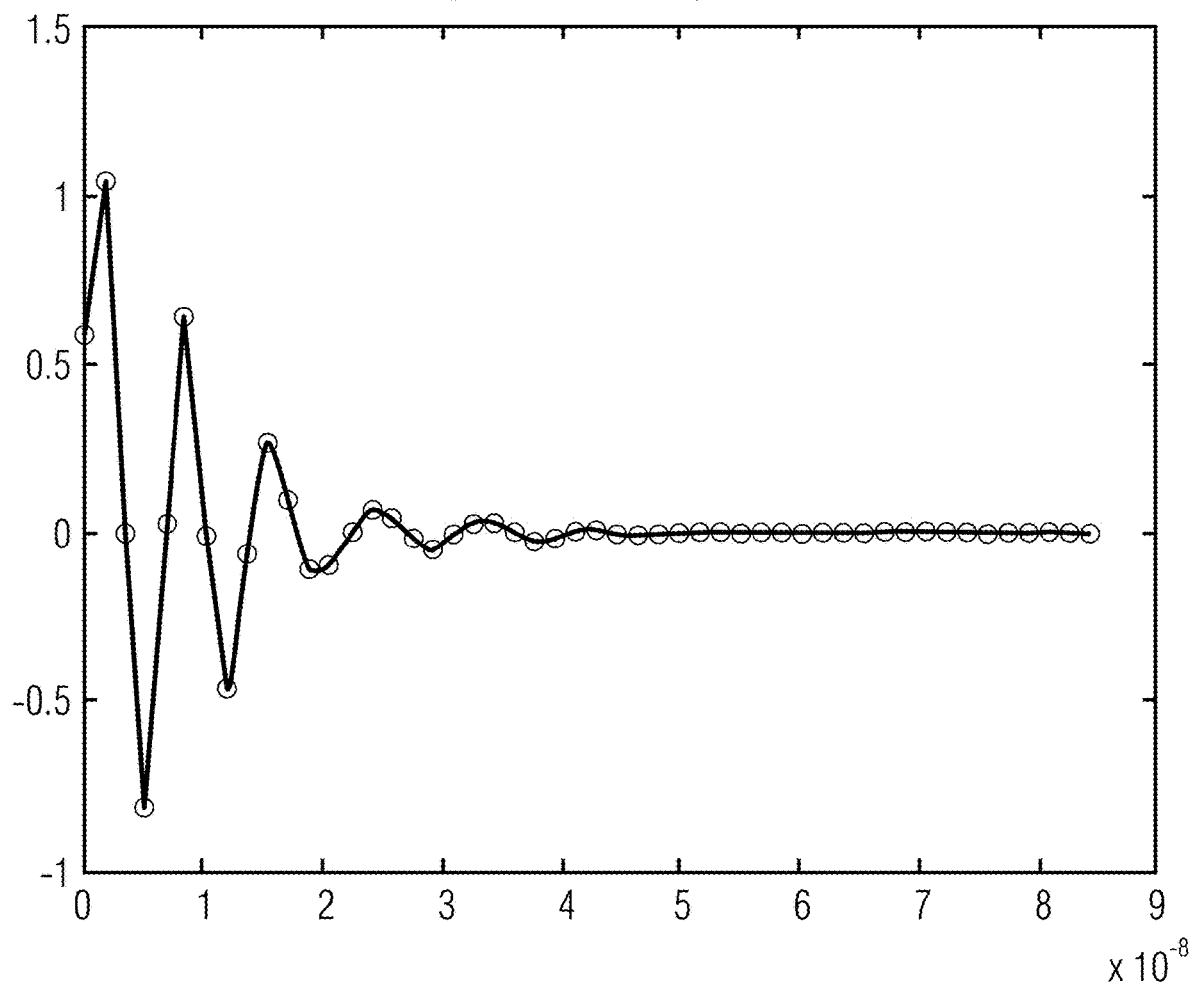

As a consequence the inverse Fourier transform of the complex compensation function H_f4 is a causal impulse response. In the given case of the Numerobis digitizer channel the impulse response is shown in FIG. 4c.

It is important to mention that the impulse response as obtained with the above mentioned algorithm rapidly converges to zero on the positive time axis. The circles along the solid trace indicate the sampling points for the inverse Fourier transform. As a result of the filter order selection for the target Butterworth characteristic as well as the corner frequency setting, the smooth frequency characteristic of the compensation function leads to a time limited impulse response (FIG. 4c) that can be represented with a very short number of samples. In the impulse response, the samples close to zero need not to be taken into account for FIR filtering. Therefore the number of taps of the FIR filter implementing the compensation function is pretty limited. This results in a high processing speed and a small area on the silicon as well as on the PC-board.

Figure 4D:
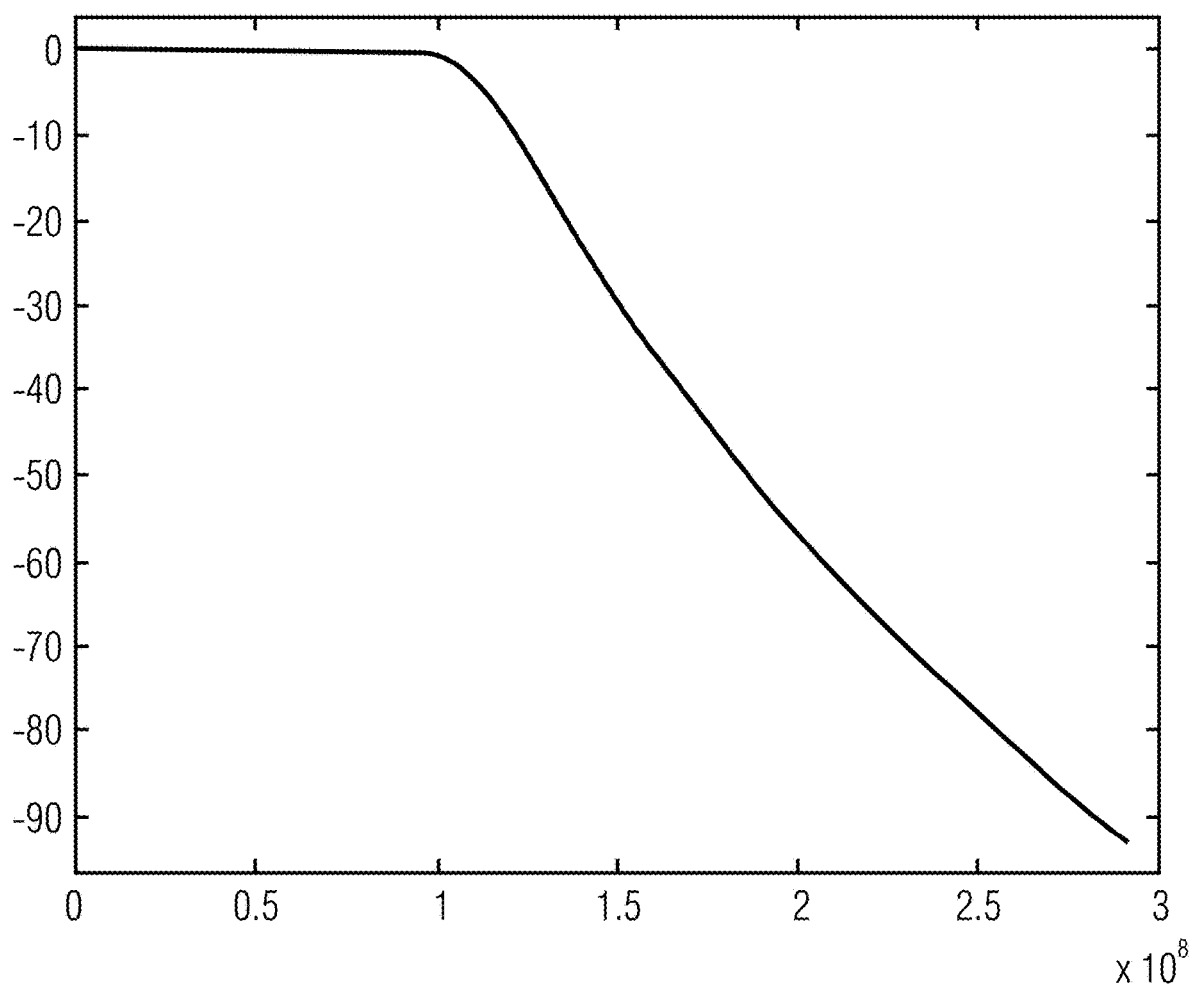

FIG. 4d shows the final result of the compensation and reflects the frequency characteristic of the calibrated instrument. The magnitude of it actually is the product of the compensation magnitude function and the measured instrument magnitude characteristic in the frequency domain. The phase of the calibrated instrument results from the compensation function only since the instrument characteristic measured with the level meter just contains a zero phase. However, it is important to state that the resulting phase of the calibrated instrument is still related to the magnitude and, when inversely Fourier transformed, yields a causal impulse response.

Figure 4E:
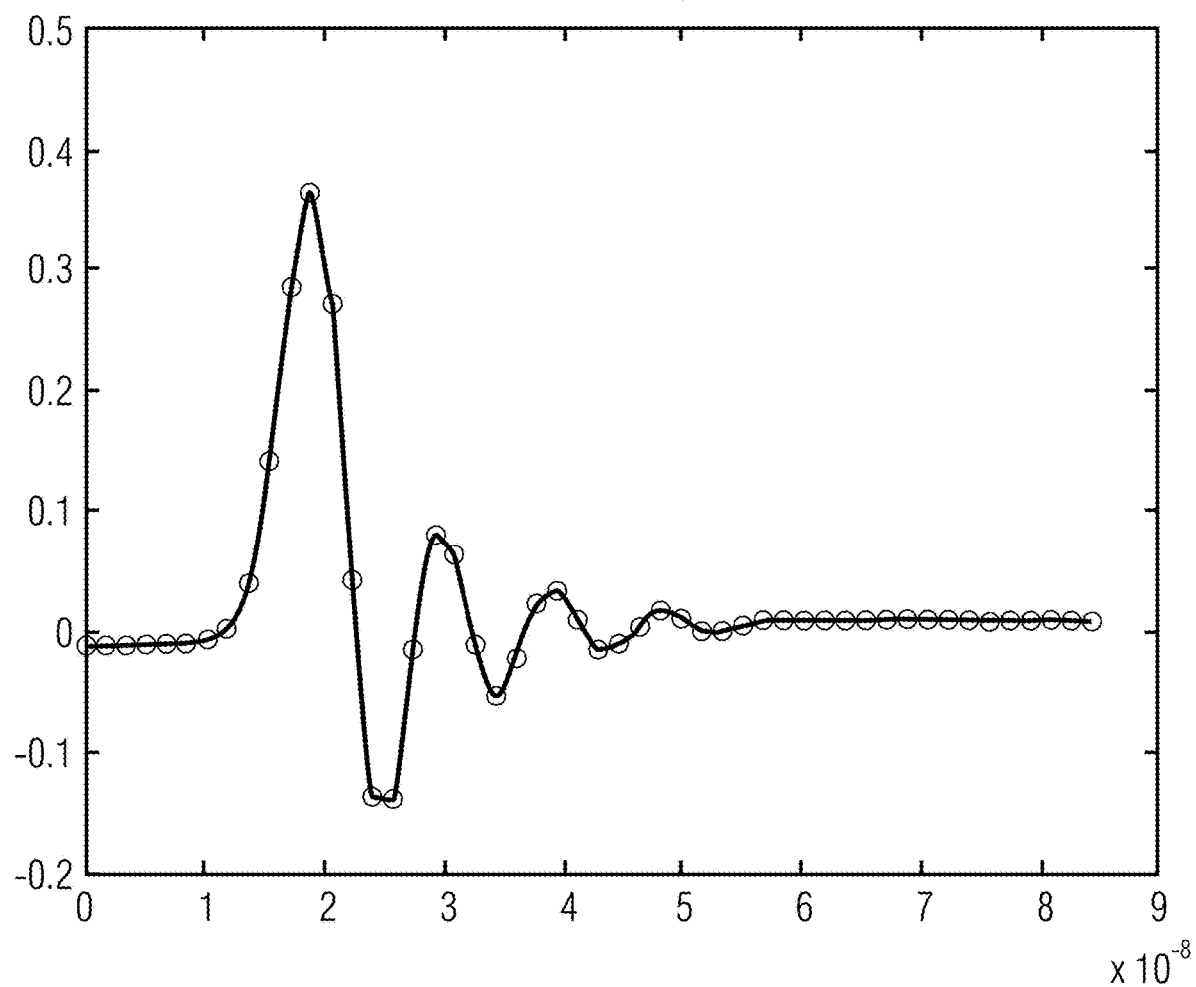

The final impulse response of the calibrated instrument in case of one Numerobis digitizer is show in FIG. 4e. As it can be seen, the impulse response is still causal and finite in its length. The tail of the impulse response shows no ringing and converges rapidly towards zero. Therefore it can be expected a benign and stable reaction of the calibrated instrument to signals with discontinuities or even pulses with steep edges.

Figure 4F:
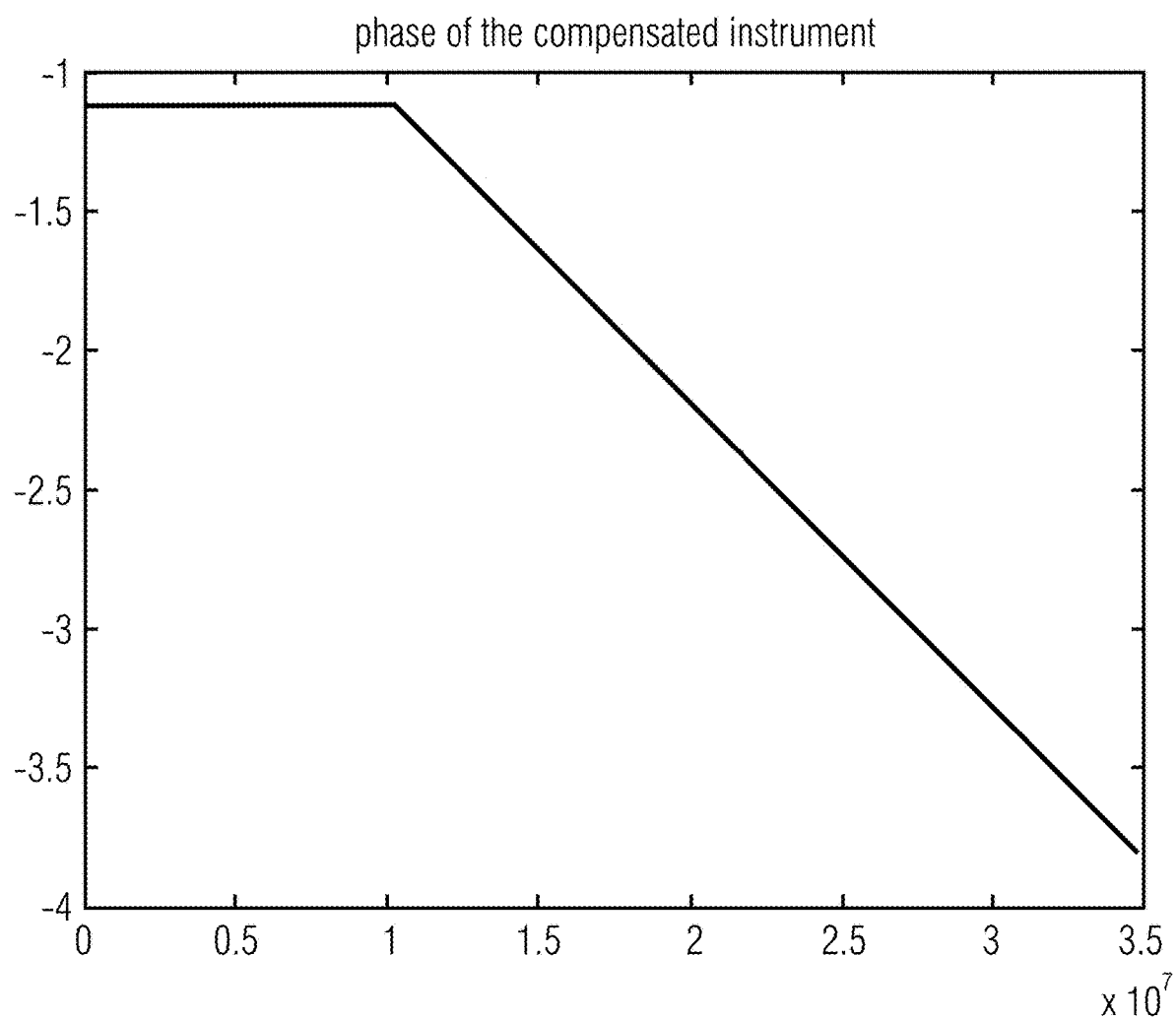

It is also important to state that the Hilbert phase yields an almost linear phase when the magnitude characteristic does not change with frequency. This is particularly the case for the pass band. Only in the transition from the pass to the stop band, where the magnitude characteristic changes dramatically with frequency, changes in the group delay are expected, too. This is in agreement with the Fourier and Hilbert theory. The phase of the calibrated Numerobis DTZ channel is shown in FIG. 4f.

For an AWG channel the AC flatness calibration is equivalent to the DTZ. The main difference is that the signal data need to be compensated before they are downloaded to the DAC. This needs not to be done at realtime. Therefore the filtering can be done at time of testprogram generation and does not affect the actual testtime. The AC flatness calibration of all the analog IO channels on the basis of the factory calibrated level meter is thus easily possible on the ATE with the calibration software algorithm as described according to this invention. The benefit per channel for the hardware FIR compensation filtering is mainly on the digitizer channels due to significantly reduced test times. This test time benefit is particularly an economic factor when many analog test channels are used in parallel for multi site test applications.

The Time-Discrete Hilbert Transform may be calculated as following: In the continuous time and frequency domain, when causality is assumed (s(t)=0 for t<0), the even time domain function corresponds to the real portion of the frequency characteristic and the odd time domain function corresponds to the imaginary frequency characteristic. The even time domain function, in this respect is formed from se(t)=0.5*(s(t)+s(−t)) and the odd time domain function so(t)=0.5*(s(t)−s(−t)). The sign function (+1 for t>0, −1 for t<0) can be used to transform the even in the odd time domain function with a simple multiplication. This means for example so(t)=se(t)*sign(t). Therefore, in the frequency domain, the imaginary part of the frequency characteristic can be calculated from the real part by a convolution with the sign function. This convolution integral containing the sign function is also termed the Hilbert integral.

On the other hand, when the time domain function is complex and the spectrum is forced to be 0 for f<0, the even frequency function corresponds to the real portion of the time domain signal and the odd frequency function corresponds to the imaginary time domain function. Such a time domain signal is often called an analytic time signal and is used in various modulation applications. Again, the even and odd frequency functions can be calculated from each other by a multiplication with the sign function which in the time domain is a convolution with the sign function.

As for the continuous time and frequency domain similar solutions exist for the discrete time and frequency domain solutions exist to the computation of the Hilbert transform.

Matlab provides a function hilbert.m that calculates the imaginary part that belongs to the real part of discrete analytic signal by first transforming it into the frequency domain resulting in an even frequency function and then multiplying its spectrum with the sign function yielding the odd frequency function. When both are added, the spectrum is zero for f<0, this means in the time domain a complex analytical signal is formed.

```
n=length(xr);
x=fft(xr);
h=zeros(1,n);
if mod(n,2)
% odd
h(1)=1;
h(2:(n+1)/2)=2;
else
% even
h([1 n/2+1])=1;
h(2:n/2)=2;
end
x=ifft(x.*h);
```

This Matlab code was derived from an algorithm described by S. Lawrence Marple et al. "Calibration of Sample-Time Error in a Two-Channel Time-Interleaved Analog-to-Digital Converter," IEEE Transactions on Circuits and Systems, I: Regular Papers, vol. 51, no. 1, Jan. 1, 2004, pages 130-139. However, this algorithm can also be used in the inverse direction to compute the imaginary part of a frequency characteristic when a time domain signal is zero for t<0 (causal time function). Just the roles of the Fourier- and inverse Fourier-transform have to be exchanged. This means in Matlab the following code segment can be used:

```
n=length(xr);
x=fft(xr);
h=zeros(1,n);
if mod(n,2)
% odd
h(1)=1;
h(2:(n+1)/2)=2;
else
% even
h([1 n/2+1])=1;
h(2:n/2)=2;
end
x=ifft(x.*h);
```

Figure 4G:
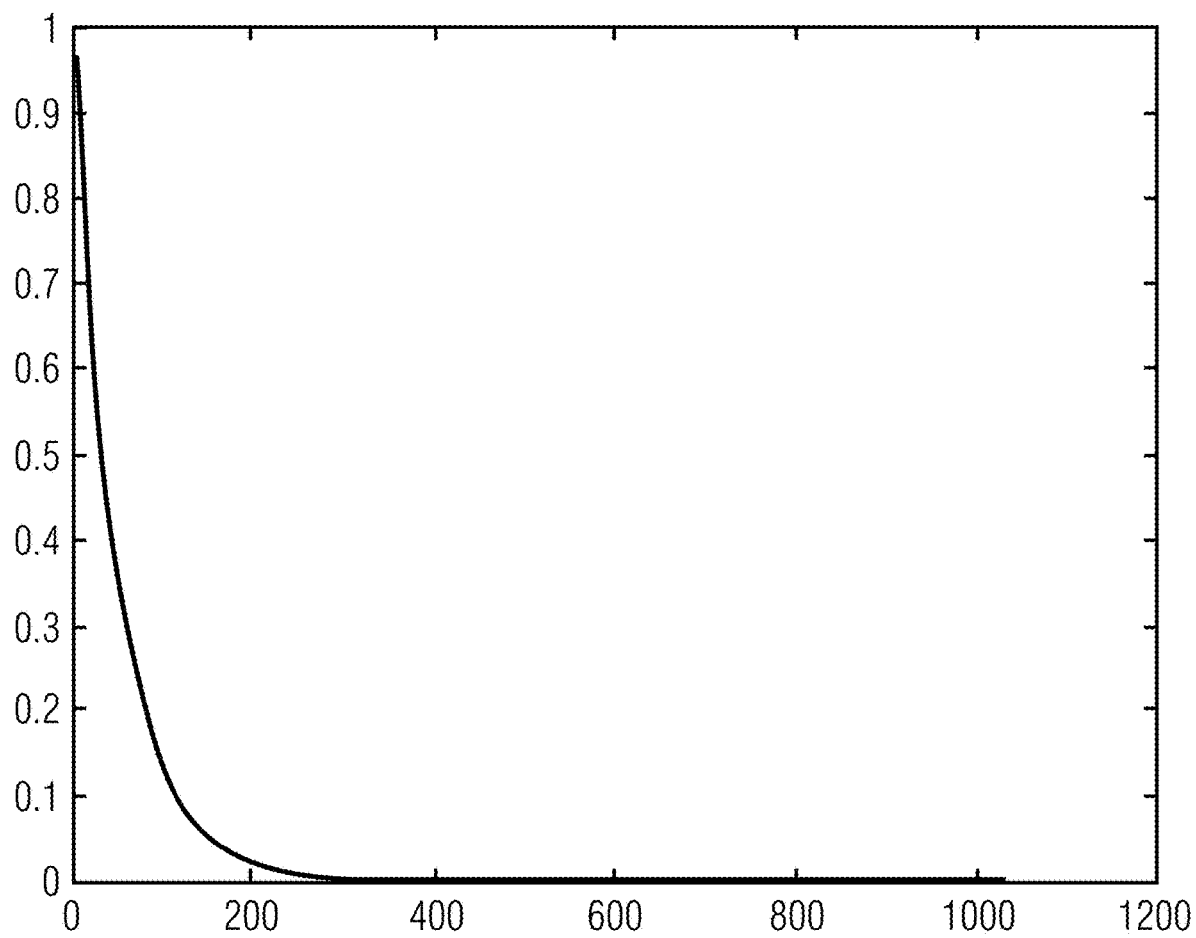

This piece of code is demonstrated for a simple negative exponential time domain function which is assumed to be causal. The time constant for the decay of the function was chosen such that the function is close to zero for the right end of the DFT window (FIG. 4g).

Figure 4H:
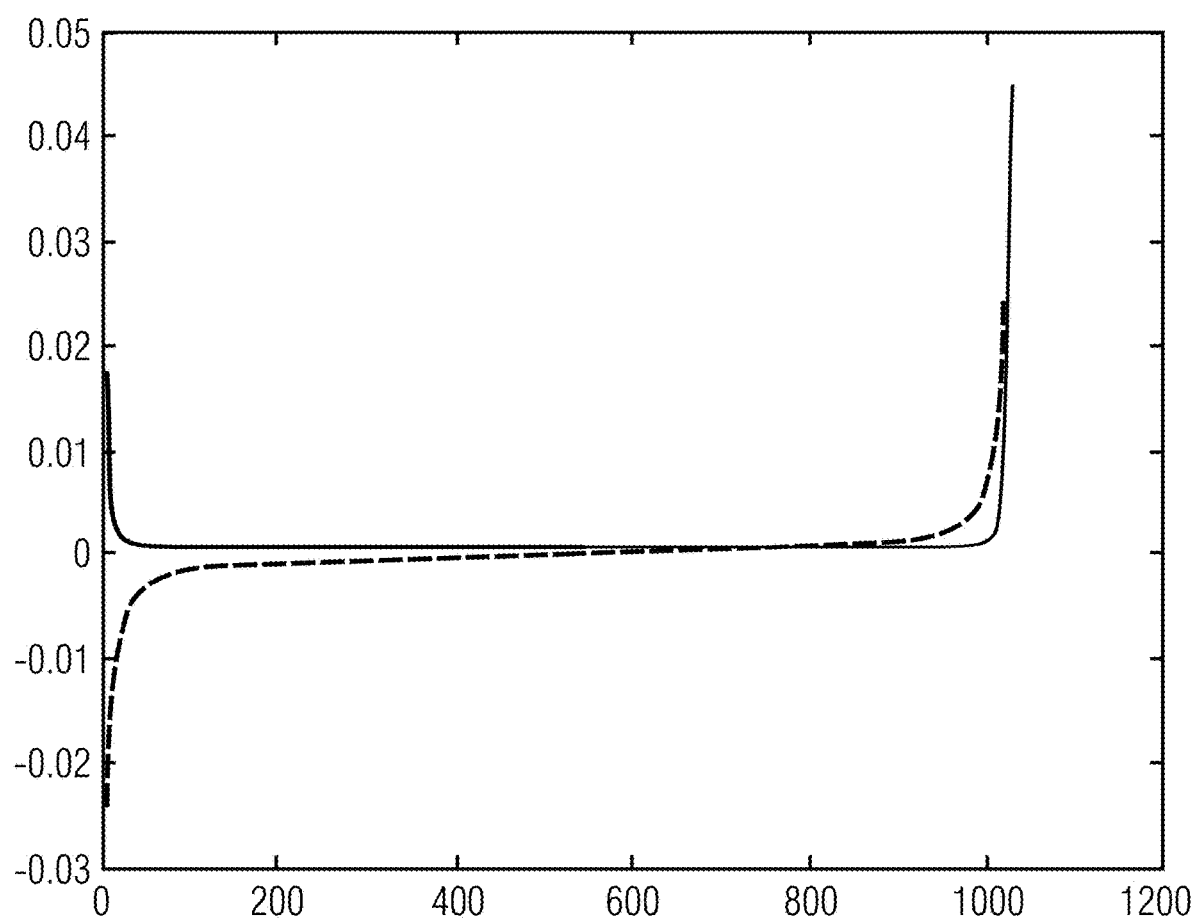
Figure 4I:
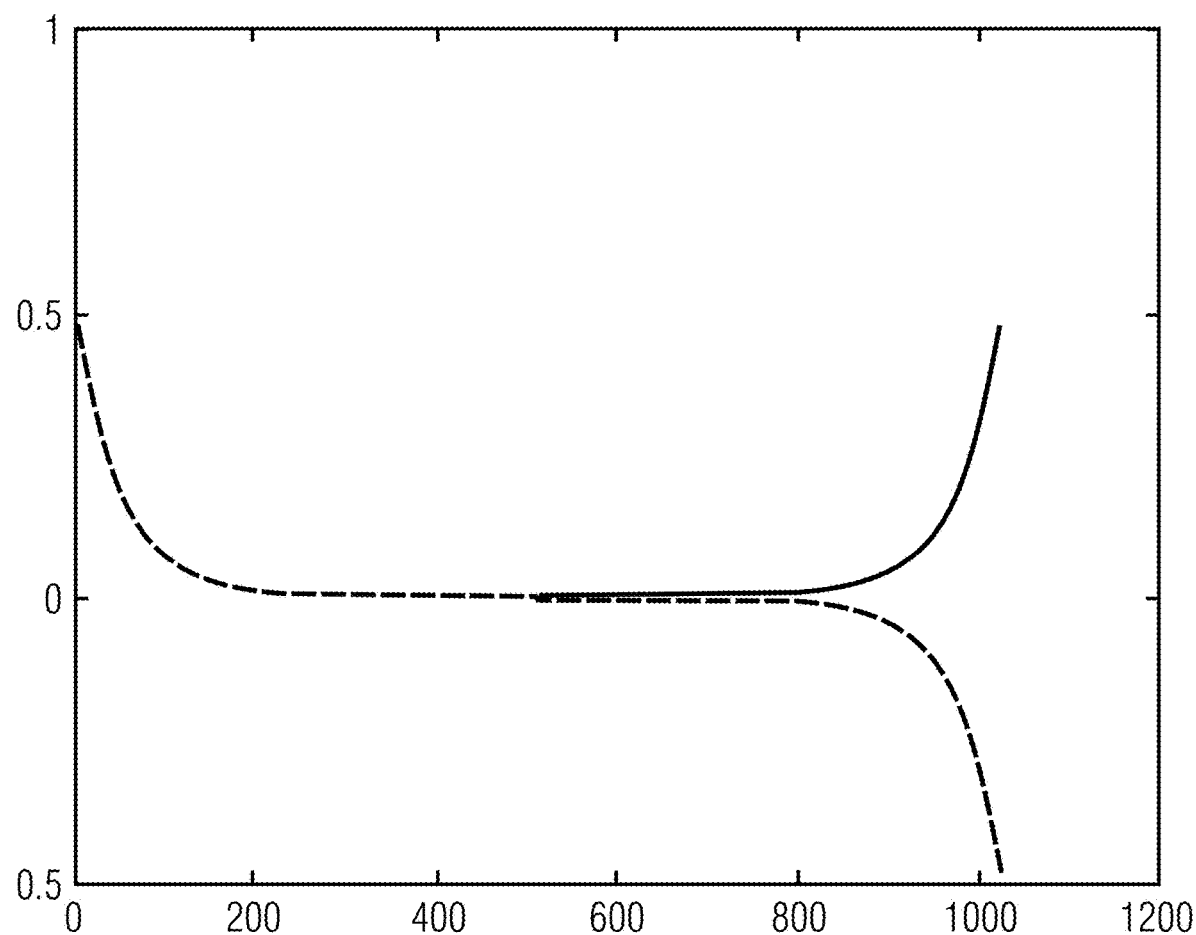
Figure 4J:
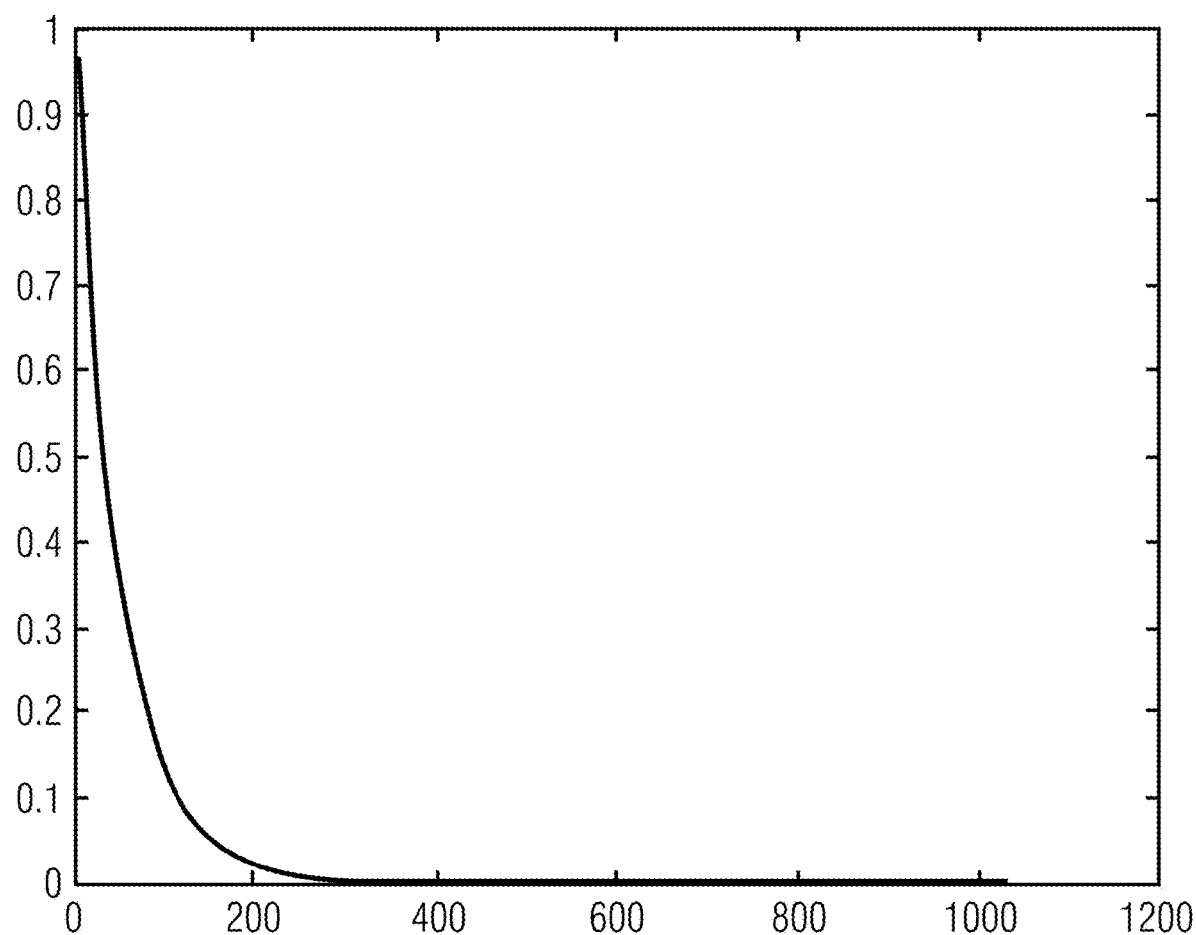

FIG. 4h shows the corresponding frequency characteristic obtained from calculating the DFT. When now the imaginary part of this spectrum is substituted with the Hilbert transform of the real portion of the frequency domain the correctness of the operation can be verified by the inverse Fourier transform of the real and imaginary portion. The even and odd time functions can be constructed from the individual inverse Fourier transform of the real portion of the frequency characteristic and the substituted Hilbert portion as an imaginary part (see FIG. 4i). The correctness of the time domain signal can be validated by comparing the sum of even and odd function with the original e-function (FIG. 4j).

The above embodiments may be implemented as an apparatus, as a combination of an apparatus and a processor like a CPU performing some method steps or as a processor performing the entire method. All three types of implementation have the following advantages:

- Reduction of the on-board measurement means associated with the calibration of a single IO channel to a level meter with small footprint and minimum hardware infrastructure.
- An optional switching matrix in the IO stage of the analog IO channel that is able to either switch the regular analog path between pogo connector and instrument or to switch the AWG output to the level meter or to switch an interconnection path between AWG output and DTZ input or to switch the level meter to the pogo connector.
- An optional signal processing unit capable of performing a digital FIR filtering on digital signal data either downloaded to the AWG or captured from the DTZ
- An optional factory calibration procedure that calibrates the level meter by connecting the level meter to external instrumentation by using the IO switching matrix and storing the data on board.
- A user calibration procedure that first calibrates the AWG with the factory calibrated level meter followed by a calibration of the DTZ with the user calibrated AWG.
- The user calibration procedure refers to a maximally flat filter characteristic (Butterworth filter type) specified in magnitude and phase for a given filter order and cutoff frequency as the calibration goal or any other suitable frequency characteristic
- The user calibration of AWG and DTZ data start with measuring just the magnitude data of the actual frequency characteristic.
- The user calibration procedure advantageously, but not necessarily uses a compensation magnitude function that is the quotient of the magnitude characteristic of the target maximally flat filter characteristic and the measured instrument magnitude characteristic.
- For the compensation magnitude function a complementing compensation phase function may, for example, be calculated using the Hilbert transform. The relationship between the magnitude compensation function and its phase induced by using the Hilbert transform ensures a causal compensation system. Causality manifests in an impulse response of the compensation system (comprising now magnitude and phase) that is equal to zero for t<0.
- FIR filter coefficients may be calculated from sampling the causal impulse response of the compensation system obtained by inversely Fourier transforming the compensation function consisting of magnitude and Hilbert phase.

According to a further embodiment, the above discussed calculator for calculating the Hilbert phase may be replaced by another type of calculator, namely a calculator which is configured to perform a linear phase calculation or may be enhanced by such a linear phase calculator.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A test equipment, comprising:
   a signal input/signal output unit configured to receive and/or transmit electrical signals for testing a device under test (DUT);
   a user-site calibration unit operable to determine a user-site compensation function comprising a compensation magnitude function and a compensation Hilbert phase function, wherein the user-site calibration unit comprises:
      a level meter configured to measure a magnitude characteristic of an electrical signal of the electrical signals to generate a measured magnitude characteristic, wherein the magnitude characteristic is a basis for determination of the compensation Hilbert phase function; and
      a calculator configured to determine a Hilbert phase characteristic of the electrical signal based on a Hilbert transformation of a function dependent on the measured magnitude characteristic and configured to determine the compensation Hilbert phase function based on the Hilbert phase characteristic, wherein the function dependent on the magnitude characteristic is the compensation magnitude function; and
   a signal processor operable to apply the user-site compensation function to an electrical signal associated with the signal input/signal output unit to perform gain and phase related compensation thereto when testing the DUT.

2. The test equipment according to claim 1, wherein the compensation magnitude function is a quotient of the measured magnitude characteristic and of a magnitude characteristic of a target filter function.

3. The test equipment according to claim 2, wherein the calculator is further configured to determine the Hilbert phase characteristic by calculating a user-site compensation equation system comprising the compensation magnitude function and a complementing compensation Hilbert phase function, wherein the user-site compensation equation system is solvable by using a causality condition for the user-site compensation equation system.

4. The test equipment according to claim 3, wherein the causality condition is true if an impulse response of the user-site compensation equation system for a point of time before receiving the electrical signal is zero.

5. The test equipment according to claim 3, wherein the causality condition is true under condition that $$\mathrm{Im}H_k(f) = -\frac{1}{\pi}\int_{-\infty}^{+\infty}\frac{\mathrm{Re}H_k(u)}{f-u}du = -\mathcal{H}\{\mathrm{Re}H_k(f)\}$$

and $$\mathrm{Re}H_k(f) = +\frac{1}{\pi}\int_{-\infty}^{+\infty}\frac{\mathrm{Im}H_k(u)}{f-u}du = +\mathcal{H}\{\mathrm{Im}H_k(f)\}.$$

6. The test equipment according to claim 3, wherein the user-site calibration unit is further configured to determine user-site filter coefficients that describe the user-site compensation function, wherein the user-site filter coefficients are FIR filter coefficients calculated from sampling a causal impulse response of the user-site compensation equation system acquired by inversely Fourier transforming the user-site compensation function.

7. The test equipment according to claim 1, wherein the Hilbert transformation of the function dependent on the measured magnitude characteristic is based on calculation of $$se(t)=0.5*(s(t)+s(-t)),$$

for an even time domain function corresponding to a real portion of a frequency characteristic of the electrical signal, and
based on calculation of $$so(t)=0.5*(s(t)-s(-t)),$$

for an odd time domain function corresponding to an imaginary portion of the frequency characteristic of the electrical signal,
wherein a sign function (+1 for t>0, −1 for t<0) is used to transform the even time domain function into the odd time domain function.

8. The test equipment according to claim 1, wherein the compensation magnitude function and the compensation Hilbert phase function are frequency-dependent functions.

9. The test equipment according to claim 1, wherein the user-site calibration unit is further configured to determine user-site filter coefficients that describe the user-site compensation function, wherein the user-site filter coefficients represent user-site calibration data.

10. The test equipment according to claim 1, further comprising:
    a factory-site compensation unit comprising a memory configured to store thereon a factory-site compensation function and a digital signal processor coupled to the signal input/signal output unit and configured to process the electrical signal using the factory-site compensation function to generate a processed electrical signal, wherein the level meter is configured to measure the magnitude characteristic of the processed electrical signal.

11. The test equipment according to claim 1, further comprising a digital signal processor coupled to the signal input/signal output unit and configured to process the electrical signal by using the user-site compensation function.

12. The test equipment according to claim 11, wherein the digital signal processor is a digital FIR filter configurable by using a factory-site compensation function and/or the user-site compensation function.

13. The test equipment according to claim 11, wherein processing of the electrical signal using a factory-site compensation function and/or the user-site compensation function enables a gain and phase related compensation of the electrical signal.

14. The test equipment according to claim 1,
    comprising a digital-analog-converter coupled to the signal input/signal output unit and configured to output arbitrarily the electrical signal in accordance to a digital function; and/or
    comprising an analog-digital-converter coupled to the signal input/signal output unit and configured to digitalize the electrical signal.

15. The test equipment according to claim 14, wherein the signal input/signal output unit comprises a switching matrix configured to connect selectively one of a first signal processing path comprising the digital-analog-converter, a second signal processing path comprising the analog-digital-converter, or the level meter to the signal input/signal output unit.

16. The test equipment according to claim 1, wherein the signal input/signal output unit is a differential signal input/signal output unit.

17. The test equipment according to claim 1, wherein the calculator is further configured to determine a phase characteristic of the electrical signal based on a linear phase transformation of the function dependent on the measured magnitude characteristic and configured to determine a compensation phase function on the basis of the phase characteristic, wherein the compensation phase function is used instead of the compensation Hilbert phase function.

18. A method for operating a test equipment, comprising:
   determining a user-site compensation function comprising a compensation magnitude function and a compensation Hilbert phase function by using a user-site calibration unit, wherein said determining comprises:
      receiving and/or transmitting electrical signals for testing a device under test (DUT);
      measuring a magnitude characteristic of the electrical signal to generate a measured magnitude characteristic, wherein the magnitude characteristic is a basis for determination of the compensation Hilbert phase function;
      determining a Hilbert phase characteristic of the electrical signal based on a Hilbert transformation of a function dependent on the measured magnitude characteristic, wherein the function dependent on the magnitude characteristic is the compensation magnitude function; and
      applying the user-site compensation function to an electrical signal of the electrical signals to perform gain and phase related compensation thereto when testing the DUT.

19. The method according to claim 18, wherein said receiving, said measuring, and said determining the Hilbert phase characteristic are performed in response to start of the test equipment.

20. A non-transitory digital storage medium having stored thereon a computer program for performing a method for operating a test equipment, the method comprising:
   determining a user-site compensation function comprising a compensation magnitude function and a compensation Hilbert phase function by using a user-site calibration unit, wherein said determining comprises:
      receiving and/or transmitting electrical signals for testing a device under test (DUT);
      measuring a magnitude characteristic of the electrical signal to generate a measured magnitude characteristic, wherein the magnitude characteristic is a basis for determination of the compensation Hilbert phase function;
      determining a Hilbert phase characteristic of the electrical signal based on a Hilbert transformation of a function dependent on the measured magnitude characteristic, wherein the function dependent on the magnitude characteristic is the compensation magnitude function; and
      applying the user-site compensation function to an electrical signal of the electrical signals to perform gain and phase related compensation thereto when testing the DUT.

21. A test equipment, comprising:
   a user-site calibration unit configured to determine a user-site compensation function comprising a compensation magnitude function and a compensation phase function, wherein the user-site calibration unit comprises:
      a signal input/signal output unit configured to receive and/or transmit electrical signals for testing a device under test (DUT);
      a level meter configured to measure a magnitude characteristic of the electrical signal to generate a measured magnitude characteristic, wherein the magnitude characteristic is a basis for determination of the compensation phase function; and
      a calculator configured to determine a phase characteristic of the electrical signal based on a linear phase transformation of a function dependent on the measured magnitude characteristic and configured to determine the compensation phase function based on the phase characteristic, wherein the function dependent on the magnitude characteristic is the compensation magnitude function; and
   a signal processor operable to apply the user-site compensation function to an electrical signal of the electrical signals associated with the signal input/signal output unit to perform gain and phase related compensation thereto when testing the DUT.

* * * * *